United States Patent
Chungpaiboonpatana et al.

(10) Patent No.: US 6,674,174 B2
(45) Date of Patent: Jan. 6, 2004

(54) CONTROLLED IMPEDANCE TRANSMISSION LINES IN A REDISTRIBUTION LAYER

(75) Inventors: Surasit Chungpaiboonpatana, Irvine, CA (US); Hassan S. Hashemi, Laguna Niguel, CA (US); Siamak Fazelpour, San Diego, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 31 days.

(21) Appl. No.: 10/012,812

(22) Filed: Nov. 13, 2001

(65) Prior Publication Data

US 2003/0193078 A1 Oct. 16, 2003

(51) Int. Cl.$^7$ ................................................. H01L 23/48
(52) U.S. Cl. ........................ 257/778; 257/690; 257/758; 361/772
(58) Field of Search ................................ 257/777, 778, 257/786, 780, 698, 737; 174/261, 262

(56) References Cited

U.S. PATENT DOCUMENTS

| | | | | |
|---|---|---|---|---|
| 5,604,379 A | * | 2/1997 | Mori ........................... | 257/738 |
| 5,677,576 A | * | 10/1997 | Akagawa ..................... | 257/785 |
| 5,683,942 A | * | 11/1997 | Kata et al. .................. | 437/209 |
| 5,726,489 A | * | 3/1998 | Matsuda et al. ............. | 257/659 |
| 6,048,753 A | * | 4/2000 | Farnworth et al. .......... | 438/111 |
| 6,078,100 A | * | 6/2000 | Duesman et al. ............ | 257/690 |
| 6,248,429 B1 | * | 6/2001 | Akram et al. ................ | 428/210 |
| 6,249,047 B1 | * | 6/2001 | Corisis ........................ | 257/691 |
| 6,262,473 B1 | * | 7/2001 | Hashimoto ................... | 257/668 |
| 6,297,553 B1 | * | 10/2001 | Horiuchi et al. ............. | 257/737 |
| 6,313,532 B1 | * | 11/2001 | Shimoishizaka et al. ..... | 257/734 |
| 6,331,736 B1 | * | 12/2001 | Duesman et al. ............ | 257/778 |
| 6,344,696 B2 | * | 2/2002 | Nakamura et al. ........... | 257/786 |
| 6,380,492 B1 | * | 4/2002 | Yoshioka ..................... | 174/256 |
| 6,407,450 B1 | * | 6/2002 | Verma et al. ................ | 257/697 |
| 6,407,451 B2 | * | 6/2002 | Akram et al. ................ | 257/698 |

* cited by examiner

*Primary Examiner*—Kamand Cuneo
*Assistant Examiner*—Lourdes Cruz
(74) *Attorney, Agent, or Firm*—Farjami & Farjami LLP

(57) ABSTRACT

In one embodiment, the invention includes first and second transmission lines fabricated in a redistribution layer over a semiconductor die. The first transmission line has a first distance from a first ground return path formed in a first metal level. The first transmission line has a first impedance corresponding to the first distance. In other words, the impedance of the first transmission line is affected by the distance between the first transmission line and the first ground return path. Similar to the first transmission line, the second transmission line has a second distance from a second ground return path formed in a second metal level. The second transmission line has a second impedance corresponding to the second distance. In other words, the impedance of the second transmission line is affected by the distance between the second transmission line and the second ground return path.

25 Claims, 3 Drawing Sheets

CONTROLLED IMPEDANCE TRANSMISSION LINES IN A REDISTRIBUTION LAYER

BACKGROUND OF THE INVENTION

1. Field of the Invention

The present invention is generally in the field of semiconductor circuits. More specifically, the present invention is in the field of transmission line impedance control in semiconductor circuits.

2. Background Art

Consumer demand for smaller, more complex, and faster devices operating at high frequencies, such as wireless communications devices and Bluetooth RF transceivers, has resulted in an increased demand for semiconductor dies with higher densities. As the density of the semiconductor die increases, the number of input/output ("I/O") pads on the periphery of the semiconductor die also increases. As a result, there is a diminishing amount of space on the periphery of the semiconductor die in which to place the I/O pads. To solve this problem, semiconductor manufacturers are moving to area array I/O designs.

In an area array I/O design, I/O pads on the periphery of the semiconductor die are relocated to an area array in the center of the semiconductor die using a redistribution layer ("RDL"). Typically, the RDL is a thin film routing layer formed primarily from aluminum or copper. The RDL comprises interconnect lines, also referred to as transmission lines in the present application, that provide electrical connections between I/O pads on the periphery of the semiconductor die and solder bumps in an area array configuration. Under bump metal ("UBM") is used to attach the solder bumps to the interconnect lines.

The interconnect lines, i.e. the transmission lines, in the RDL are driven by I/O drivers (or "line drivers") located near the I/O pads in the semiconductor die. The I/O drivers expect to interface with transmission lines having a certain impedance. If the impedance of a transmission line does not match the impedance of its respective I/O driver, the transmission of electrical signals through the transmission line will not occur in an optimized manner and will be generally slowed down.

One approach used to reduce the impact of this impedance mismatch problem has been to increase the strength of the I/O driver. However, utilization of substantially stronger I/O drivers will increase the cost of manufacturing the semiconductor die. Another approach used to address the problem has been to increase the number of I/O drivers that drive the transmission line. However, increasing the number of I/O drivers also increases the cost of manufacturing the semiconductor die.

Thus, there is a need in the art for a transmission line in an RDL that can match a required impedance of an I/O driver in a semiconductor die.

SUMMARY OF THE INVENTION

The present invention is directed to controlled impedance transmission lines in a redistribution layer. The invention overcomes the need in the art for transmission lines in a redistribution layer that can match required impedances of I/O drivers in a semiconductor die.

In one embodiment, the invention includes first and second transmission lines fabricated in a redistribution layer over a semiconductor die. The first transmission line has a first distance from a first ground return path formed in a first metal level. For example, the first ground return path might be formed in metal level six within the semiconductor die. The first transmission line has a first impedance corresponding to the first distance. In other words, the impedance of the first transmission line is affected by the distance between the first transmission line and the first ground return path, which in this example is the distance between the first transmission line and the ground return path formed in metal level six.

Similar to the first transmission line, the second transmission line has a second distance from a second ground return path formed in a second metal level. For example, the second ground return path might be formed in metal level five within the semiconductor die. The second transmission line has a second impedance corresponding to the second distance. In other words, the impedance of the second transmission line is affected by the distance between the second transmission line and the second ground return path, which in this example is the distance between the second transmission line and the ground return path formed in metal level five.

Thus, by determining which particular metal level in the semiconductor die should serve as a ground return path for a particular transmission line, the invention results in an additional control over the impedance of transmission lines, beyond the conventional control over the impedance which consisted of controlling parameters such as width and thickness of the transmission lines.

Various other concepts, features, and advantages of the present invention are discussed in the following sections of the present application.

DETAILED DESCRIPTION OF THE INVENTION

The present invention is directed to controlled impedance transmission lines in a redistribution layer. The following description contains specific information pertaining to various embodiments and implementations of the invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
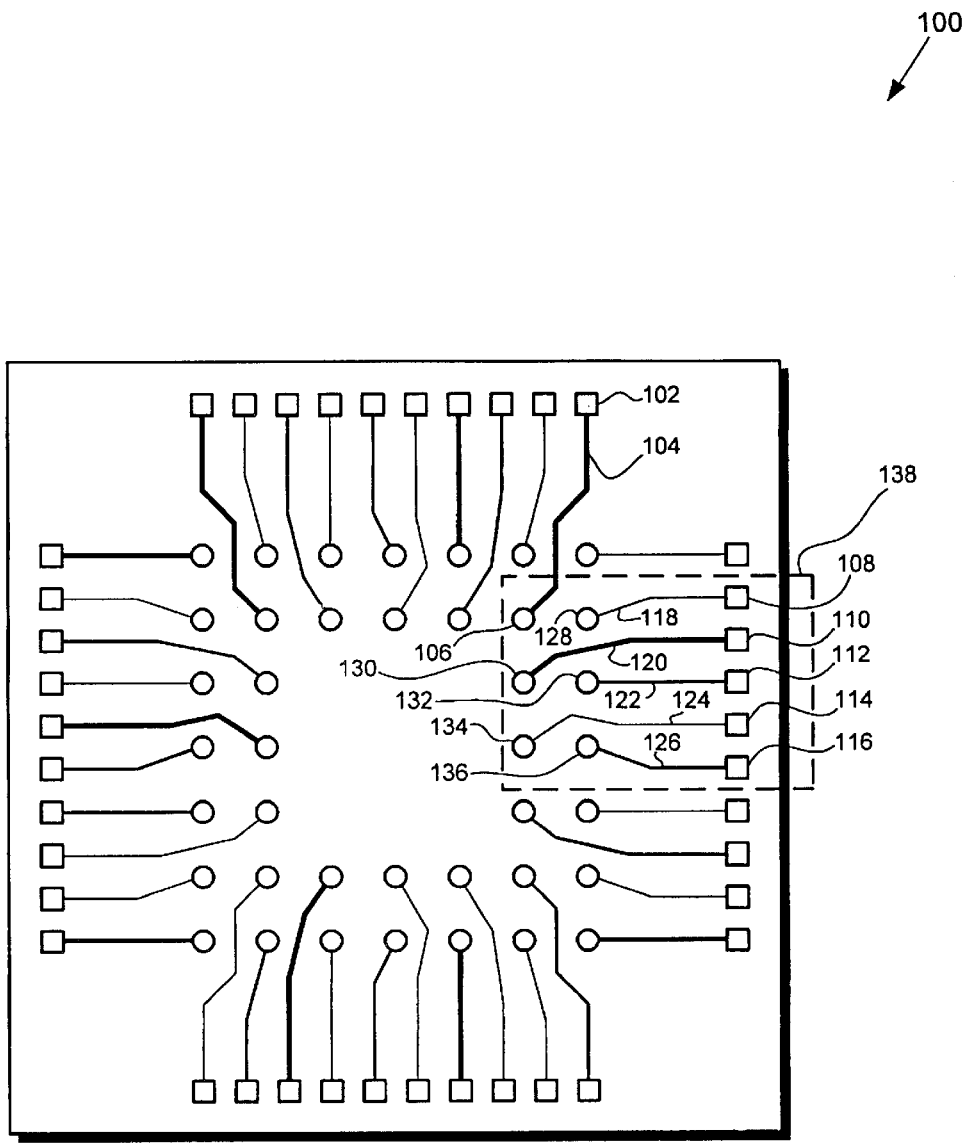
FIG. 1 illustrates a top view of an exemplary structure in accordance with one embodiment of the present invention.

Semiconductor die 100 in FIG. 1 illustrates a top view of an exemplary semiconductor die in accordance with one embodiment of the present invention. It is noted that a "semiconductor die," such as semiconductor die 100, is also referred to as a "die," a "chip," or a "semiconductor chip" in the present application. Those skilled in the art will appreciate that various elements and features are not shown in FIG. 1 to avoid obscuring the invention and to facilitate the description of FIG. 1. For example, a layer of dielectric, such as Benzocyclobutene ("BCB"), that is typically deposited over transmission lines, such as transmission line 104, is not shown in FIG. 1 to allow the transmission lines to be viewed. It will be shown in relation to FIG. 1, and further in relation to FIGS. 2 and 3, that the impedance of an exemplary embodiment of the present invention's transmission line can be controlled to match a desired impedance, such as an industry standard impedance of 50.0 ohm. Also, it is noted that, in the present application, the term "transmission line" refers to an "interconnect line" and the two terms are used interchangeably.

FIG. 1 shows semiconductor die bond pad 102, which is fabricated on the periphery of semiconductor die 100. Semiconductor die bond pad 102 can be, for example, an input/output ("I/O") pad interfacing with external devices. Semiconductor die bond pad 102 can comprise aluminum or other metals, such as copper, copper-aluminum alloy, or gold. FIG. 1 also shows transmission line 104, which provides an electrical connection between semiconductor die bond pad 102 and solder bump 106. According to an embodiment of the present invention, transmission line 104 can be fabricated in a redistribution layer ("RDL") on semiconductor die 100. For example, transmission line 104 can be fabricated in an RDL utilizing a sputter deposition and etchback process. Transmission line 104 can comprise aluminum or other metals, such as copper, copper-aluminum alloy, or gold.

By way of background, solder bumps, such as solder bump 106, allow semiconductor die 100 to be mounted on an interconnect substrate (not shown in FIG. 1) using flip chip technology. As is known in the art, flip chip technology is a surface mount technology wherein the die is "flipped" over so that the active surface of the die faces an interconnect substrate. In flip chip technology, the electrical contact between the die and the interconnect substrate is achieved through an area array comprised of solder bumps, such as solder bump 106, in FIG. 1.

Also shown in FIG. 1, semiconductor die bond pads 108, 110, 112, 114, and 116 are fabricated on the periphery of semiconductor die 100. Semiconductor die bond pads 108, 110, 112, 114, and 116 are similar to semiconductor die bond pad 102 discussed above, and comprise similar material as semiconductor die bond pad 102. Further shown in FIG. 1, transmission lines 118, 120, 122, 124, and 126, respectively, electrically connect semiconductor die bond pads 108, 110, 112, 114, and 116 to solder bumps 128, 130, 132, 134, and 136. Transmission lines 118, 120, 122, 124, and 126 are fabricated in a similar manner as transmission line 104 described above. Also, transmission lines 118, 120, 122, 124, and 126 comprise similar material as transmission line 104. Transmission lines 118, 120, 122, 124, and 126 will be described in greater detail in relation to FIG. 2, and specifically with respect to the region enclosed by dashed line 138 (which corresponds to the region enclosed by dashed line 238 in FIG. 2).

Each of the above transmission lines, such as transmission line 118, is driven by a respective I/O driver (not shown in FIG. 1) connected to an I/O pad, such as semiconductor die bond pad 108. In another embodiment, the I/O drivers may be coupled to the transmission lines directly and without going through semiconductor die bond pads. When the impedance of a transmission line, such as transmission line 104, closely matches the impedance of its respective I/O driver, the signals transmitted from the 110 driver can traverse the transmission line in an optimal manner, i.e. at an optimal speed and with minimal energy loss. As a result, degradation of the quality of the signals outputted at the semiconductor die solder bumps, such as solder bump 106, can be minimized.

The width and thickness of an interconnect line (i.e. a transmission line) and the distance of the interconnect line from a reference ground line or plane, also called "a ground return path," affects the resistance, inductance and capacitance, and thus the total impedance, of the interconnect line. For example, assume that transmission line 118 is a ground line, i.e. a "ground return path." Further assume that transmission lines 126 and 122 have the same width and thickness. Assuming all other parameters are equal, since transmission line 122 is closer to transmission line 118, the inductance per millimeter of length of transmission line 122 would be lower than the inductance per millimeter of length of transmission line 126, which is further away from the ground line in this example, i.e. transmission line 118. As such, if all other parameters are equal, the impedance of transmission line 126 would be greater than the impedance of transmission line 122.

Thus, as will be shown below, the present invention provides a transmission line, such as transmission line 126 in FIG. 1, to meet a desired impedance, such as 50.0 ohms, by controlling the width and thickness of the transmission line and its distance from a reference return ground path.

Figure 2:
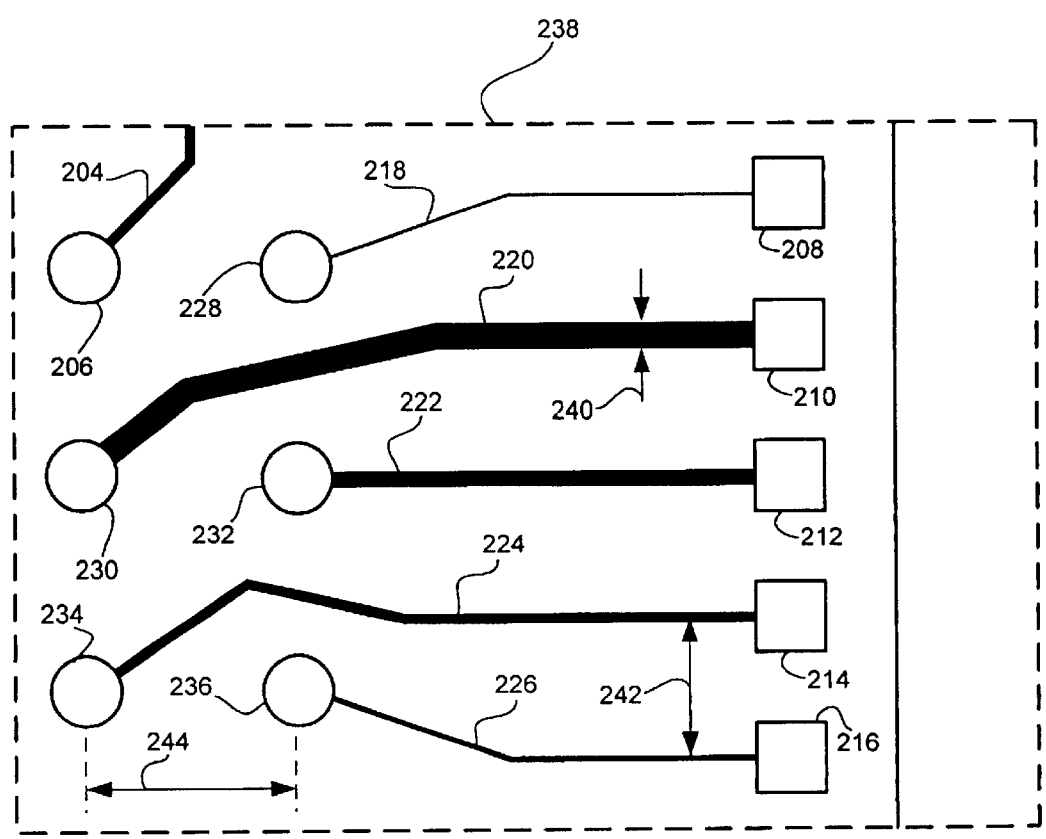
FIG. 2 illustrates an expanded view of a portion of the exemplary structure in FIG. 1 according to an embodiment of the present invention.

FIG. 2 shows a top view of region 238, which is an expanded view of region 138 in FIG. 1. In particular, semiconductor die bond pads 208, 210, 212, 214, and 216, transmission lines 204, 218, 220, 222, 224, and 226, and solder bumps 206, 228, 230, 232, 234, and 236, respectively, correspond to semiconductor die bond pads 108, 110, 112, 114, and 116, transmission lines 104, 118, 120, 122, 124, and 126, and solder bumps 106, 128, 130, 132, 134, and 136 in FIG. 1.

Also shown in FIG. 2, width 240 refers to the width of transmission line 220. As an example, width 240 might be 20.0 microns. If all other parameters remain unchanged, increasing the width of the transmission line generally results in a corresponding reduction in the impedance of the transmission line. For example, assuming that all other parameters remain unchanged, for a distance of 10.0 microns between transmission line 220 and a return ground path, increasing the value of width 240 from 20.0 microns to 35.0 microns results in a reduction in the impedance of transmission line 220 from 50.0 ohms to 35.0 ohms.

Further shown in FIG. 2, line spacing 242 refers to the spacing between two transmission lines, such as transmission lines 224 and 226, measured near the point where transmission lines 224 and 226, respectively, connect to semiconductor die bond pads 214 and 216. By way of example, line spacing 242 might be 5.0 microns. Also shown in FIG. 2, pitch 244 refers to the distance between the centers of two adjacent solder balls, such as solder balls 234 and 236. As an example, the value of pitch 244 might be 250.0 microns (it is noted that the distances in FIG. 2 are not drawn to scale).

For given values of line width and line spacing, the resistance, capacitance, and inductance of a transmission line, such as transmission line 220, vary per millimeter of length. For example, for a line width equal to 20.0 microns and a line spacing equal to 5.0 microns, the resistance of a transmission line might be approximately 1.5 ohms per millimeter of length. Also, using the above values for line width and line spacing, the capacitance and inductance, respectively, of a transmission line might be approximately 0.13 to 0.15 picofarads ("pF") and approximately 0.2 to 0.9 nano henries ("nH") per millimeter of length.

The above variation in the inductance of a transmission line per millimeter of length, i.e. 0.2 to 0.9 nH, is extremely high because the inductance of the transmission line depends on the distance between the transmission line and a ground return path. For example, if the transmission line, such as transmission line 220, is close to a ground return path, the inductance of the transmission line per millimeter of length will be close to the low end of the above inductance range, i.e. 0.2 nH. On the other hand, as the distance between the transmission line and the ground return path increases, the inductance of the transmission line per millimeter of length approaches the high end of the above inductance range, i.e. 0.9 nH.

As discussed below, critical parameters, such as the distance between a transmission line and a ground return path, are properly controlled by use of the invention's techniques described below in order for the transmission line to achieve and match a desired impedance. The control of various parameters, and in particular the distance between a transmission line and a ground return path, according to the present invention, will be further discussed below in relation to FIG. 3.

Figure 3:
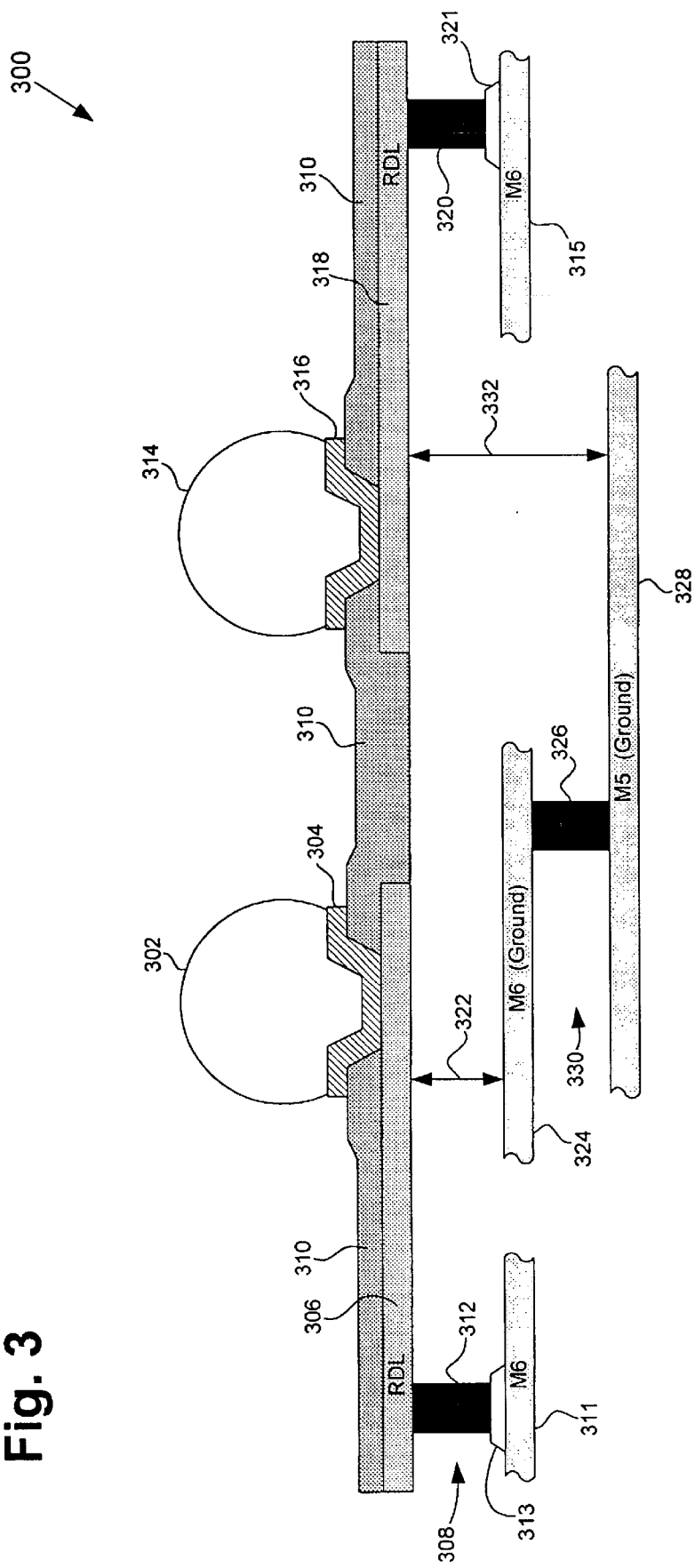
FIG. 3 illustrates a cross-sectional view of portion of a semiconductor die according to an embodiment of the present invention.

FIG. 3 shows a cross-sectional view of a semiconductor die in accordance with one embodiment of the present invention. FIG. 3 shows solder bump 302 planted on under bump metal ("UBM") 304. Solder bump 302 can provide an electrical connection between semiconductor die 300 and an interconnect substrate (not shown in FIG. 3). UBM 304 provides a surface for solder bump 302 to adhere to and also provides a low resistance electrical connection between solder bump 302 and transmission line 306. UBM 304 is fabricated in a "redistribution process." For example, UBM 304 may be fabricated on a redistribution layer using a sputter deposition process. UBM 304 can comprise a copper-chromium alloy. However, UBM 304 can comprise a stack of metals such as aluminum, nickel, vanadium, and copper.

By way of background, a "redistribution process" refers to a process whereby I/O pads on the periphery of a semiconductor die are re-routed to an area array configuration of solder bumps. The I/O pads are re-routed to the area array configuration by way of interconnect lines, i.e. transmission lines, fabricated in a redistribution layer. The resulting area array configuration of solder bumps allows the semiconductor die to be connected to an interconnect substrate utilizing, for example, flip chip technology.

FIG. 3 further shows transmission line 306, which is situated on dielectric layer 308. A first terminal of transmission line 306 is coupled to semiconductor die bond pad 313 by via 312, and a second terminal of transmission line 306 is coupled to UBM 304. In another embodiment, semiconductor die bond pad 313 may not be used. In such instance, via 312 can directly couple transmission line 306 to interconnect metal line 311, which in the present example is fabricated in metal level six. Transmission line 306 can be fabricated on the top surface of dielectric layer 308 by methods known to one of ordinary skill in the art. For example, transmission line 306 can be patterned on top surface of dielectric layer 308 utilizing a sputter deposition process. By way of further example, transmission line 306 can be patterned utilizing photoresist patterning with lift-off process. Transmission line 306 can comprise aluminum or other metals, such as copper, copper-aluminum alloy, or gold. Transmission line 306 and other transmission lines similarly fabricated on the top surface of dielectric layer 308 are part of the redistribution layer.

Dielectric layer 308 can be deposited on a passivation layer, not shown in FIG. 3, on the top surface of semiconductor die 300 by methods well established in the art, such as by a spin on process. In the present embodiment, dielectric layer 308 can comprise a polymer dielectric such as BCB, which has a dielectric constant of approximately 3.0 to 3.5. The thickness of dielectric layer 308 can be approximately 5.0 to 10.0 microns. In another embodiment, dielectric layer 308 can comprise silicon dioxide. In such instance, the thickness of dielectric layer 308 can be approximately 3.0 microns.

Also shown in FIG. 3, dielectric layer 310 is situated over dielectric layer 308. Dielectric layer 310 covers dielectric layer 308 and also covers the redistribution layer, including transmission lines such as transmission line 306. Dielectric layer 310 is deposited on dielectric layer 308 by methods well known in the art. Dielectric layer 310 can comprise similar materials as dielectric layer 308, such as BCB.

Via 312 provides a connection between transmission line 306 and semiconductor die bond pad 313 in metal level six. Via 312 can be formed in dielectric layer 308 by utilizing a photolithographic process or by other methods known to a person of ordinary skill in the art. In the present example, metal level six is the last metal level in semiconductor die 300. In other embodiments, the last metal level in the semiconductor die may be a metal level other than metal level six.

Also shown in FIG. 3, solder bump 314 is planted on UBM 316. Similar to solder bump 302 described above, solder bump 314 can also provide an electrical connection between semiconductor die 300 and an interconnect substrate (not shown in FIG. 3). UBM 316 provides a surface for solder bump 314 to adhere to and also provides a low resistance electrical connection between solder bump 314 and transmission line 318. UBM 316 comprises similar material as UBM 304 described above, and is also fabricated in a similar manner as UBM 304.

FIG. 3 further shows transmission line 318, which is situated on dielectric layer 308. A first terminal of transmission line 318 is coupled to semiconductor die bond pad 321 by via 320, and a second terminal of transmission line 318 is coupled to UBM 316. Transmission line 318 comprises similar material as transmission line 306 described above, and is also fabricated in a similar manner as transmission line 306. Via 320 provides a connection between transmission line 318 and semiconductor die bond pad 321 in metal level six. Via 320 is formed in dielectric layer 308 in a similar manner as via 312 described above. Semiconductor die bond pad 321 is coupled to interconnect metal line 315, which, in the present example, is fabricated in metal level six.

Also shown in FIG. 3, distance 322 refers to the distance between ground return path 324 in metal level six and transmission line 306. Since dielectric layer 308 is situated between metal level six and transmission line 306, distance 322 also refers to the thickness of dielectric layer 308. In one exemplary embodiment, distance 322 can be approximately 5.0 to 10.0 microns. Further shown in FIG. 3, via 326 provides a connection between ground return path 324 in metal level six and ground line 328, which is in metal level five. In another embodiment, ground return paths of the invention's transmission lines may be in the RDL. In such instance, the ground return path would be in the same "plane" as the invention's transmission lines.

Also shown in FIG. 3, dielectric layer 330 refers to a dielectric layer between metal level 6 and metal level 5 in semiconductor die 300. Dielectric layer 330 can comprise a dielectric such as silicon dioxide. Further shown in FIG. 3, distance 332 refers to the distance between ground return path 328 in metal level five and transmission line 318.

The impedance of transmission line 306 is affected by distance 322, i.e. the distance between transmission line 306 and ground return path 324 in metal level six. For example, when distance 322 is equal to 20.0 microns and for a line width of 40.0 microns for transmission line 306, the impedance transmission line 306 can be approximately 50.0 ohms. However, by increasing distance 322, the impedance of transmission line 306 will become greater than 50.0 ohms.

For a given line width and thickness, the impedance of transmission line 306 can be increased or decreased by increasing or decreasing distance 322. For example, distance 322 can be increased by increasing the thickness of dielectric layer 308, which effectively increases the distance, i.e. the separation, between transmission line 306 and return ground path 324. Distance 322 can also be increased by utilizing a return ground path in a lower metal level in semiconductor die 300, such as metal level five. For example, transmission line 318 utilizes return ground path 328, which is in metal level five. Thus, distance 332, i.e. the distance between transmission line 318 and return ground path 328 in metal level five, is greater than distance 322, i.e. the distance between transmission line 306 and return ground path 324 in metal level six. Accordingly, for the same line width and line thickness and assuming that all other parameters are unchanged, transmission line 318 will have a higher impedance than transmission line 306.

According to the present invention, the impedances of various transmission lines, such as transmission lines 306 and 318 in FIG. 3, are controlled not only by using conventional impedance control techniques, such as controlling the width and thickness of the transmission lines, but also by designing for a particular distance between each transmission line and a ground return path situated therebelow in the semiconductor die. The design and control of the distance between transmission lines and the ground return paths below them is made possible by using the RDL to fabricate the transmission lines and also by designing the distance of each transmission line from an underlying ground return path in a manner so as to result in a desired impedance, such as a 50.0 ohm impedance.

In other words, by determining which particular metal level in the semiconductor die should serve as a ground return path for a particular transmission line, the invention results in an additional control over the impedance of the transmission line, beyond the conventional control over the impedance which consisted of controlling parameters such as width and thickness of the transmission line. For example, by selecting metal level five to serve as a ground return path for one transmission line, metal level six to serve as a ground return path for another transmission line, and metal level four to serve as a ground return path for yet another transmission line, the impedances of various transmission lines fabricated in the RDL are fine tuned and optimized. By way of a specific example, FIG. 3 illustrated that by choosing metal level six to serve as the ground return path for transmission line 306, the impedance of transmission line 306 was reduced relative to the impedance of transmission line 318 which utilized metal level five as its ground return path.

As such, the invention results in a clever design of ground return paths within the semiconductor die and takes into account the RDL transmission lines that are situated above the ground lines of the semiconductor die. In contrast, in conventional techniques, the distance between ground lines existing in various metal levels and any transmission lines driven by or coupled to I/O drivers of the semiconductor die would not be taken into account, and the invention's valuable control over the impedance of RDL transmission lines did not exist. The proper distribution of ground lines under the transmission lines fabricated in the RDL takes place, for example, by appropriate layout considerations which in turn result in a proper distribution of ground lines at desired "depths," i.e. at desired metal levels, so as to result in a precise impedance, for example a 50.0 ohm impedance, for a given transmission line connected to a particular I/O driver. As one of its benefits, the present invention results in transmission lines that reduce manufacturing costs by reducing the required number and strength of I/O drivers driving the transmission lines.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, controlled impedance transmission lines in a redistribution layer have been described.

We claim:

1. A structure comprising first and second transmission lines fabricated over a semiconductor die, said structure further comprising:

said first transmission line being fabricated in a redistribution layer over said semiconductor die, said first transmission line positioned at a first controlled distance from a first ground return path formed in a first metal level in said semiconductor die, said first transmission line having a first impedance corresponding to said first controlled distance;

said second transmission line being fabricated in said redistribution layer over said semiconductor die, said second transmission line positioned at a second controlled distance from a second ground return path formed in a second metal level in said semiconductor die, said second transmission line having a second impedance corresponding to said second controlled distance.

2. The structure of claim 1 wherein said first impedance is lower than said second impedance when said first controlled distance is smaller than said second controlled distance; wherein said first impedance is higher than said second impedance when said first controlled distance is greater than said second controlled distance.

3. The structure of claim 1 wherein said redistribution layer is formed over a dielectric layer, said dielectric layer being situated over said semiconductor die.

4. The structure of claim 3 wherein said dielectric layer comprises Benzocyclobutene.

5. The structure of claim 1 wherein said first ground return path is formed by connecting ground to said first metal level at a location below said first transmission line.

6. The structure of claim 5 wherein said second ground return path is formed by connecting said ground to said second material level at a location below said second transmission line.

7. The structure of claim 1 wherein said first transmission line is coupled to a first solder ball.

8. The structure of claim 7 wherein said second transmission line is coupled to a second solder ball.

9. The structure of claim 1 wherein an impedance of said first transmission line is substantially equal to 50 ohms.

10. The structure of claim 1 wherein an impedance of said second transmission line is substantially equal to 50 ohms.

11. The structure of claim 1 wherein said redistribution layer comprises a conductor selected from the group consisting of copper, copper-aluminum alloy, and gold.

12. The structure of claim 1 further comprising a dielectric layer deposited over said redistribution layer.

13. The structure of claim 12 wherein said dielectric layer comprises Benzocyclobutene.

14. A structure comprising:
- a first transmission line situated in a redistribution layer over a semiconductor die, said first transmission line positioned at a first controlled distance from a first ground return path formed in a first metal level in said semiconductor die, said first transmission line having a first impedance corresponding to said first controlled distance;
- a first interconnect metal line within said semiconductor die, said first interconnect metal line being driven by a first I/O driver of said semiconductor die, said first interconnect metal line being coupled to said first transmission line through a first via;
- a second transmission line situated in said redistribution layer over said semiconductor die, said second transmission line positioned at a second controlled distance from a second group return path formed in a second metal level in said semiconductor die, said second transmission line having a second impedance corresponding to said second controlled distance;
- a second interconnect metal line within said semiconductor die, said second interconnect metal line being driven by a second I/O driver of said semiconductor die, said second interconnect metal line being coupled to said second transmission lines through a second via.

15. The structure of claim 14 wherein said first impedance further corresponds to a line spacing between said first transmission line and a third transmission line situated in said redistribution layer.

16. The structure of claim 14 wherein said first impedance further corresponds to a width of said first transmission line.

17. The structure of claim 14 wherein said first impedance further corresponds to a thickness of said first transmission line.

18. The structure of claim 14 wherein said second impedance further corresponds to a line spacing between said second transmission line and a third transmission line situated in said redistribution layer.

19. The structure of claim 14 wherein said second impedance further corresponds to a width of said second transmission line.

20. The structure of claim 14 wherein said second impedance further corresponds to a thickness of said second transmission line.

21. The structure of claim 14 wherein said first impedance is lower than said second impedance when said first controlled distance is smaller than said second distance; wherein said first impedance is higher than said second impedance when said first controlled distance is greater than said second controlled distance.

22. The structure of claim 14 wherein said first ground return path is formed by connecting ground to said first metal level at a location below said first transmission line.

23. The structure of claim 22 wherein said second ground return path is formed by connecting ground to said second metal level at a location below said second transmission line.

24. A structure comprising first and second transmission lines fabricated over a semiconductor die, said structure further comprising:
- said first transmission line being fabricated in a redistribution layer over said semiconductor die, said first transmission line having a first distance from a first ground return path formed in a first metal level in said semiconductor die, slid first transmission line having a first impedance corresponding to said first distance;
- said second transmission line being fabricated in said redistribution layer over said semiconductor die, said second transmission line having a second distance from a second ground return path formed in a second metal level in said semiconductor die, said second transmission line having a second impedance corresponding to said second distance;
- said first impedance being lower than said second impedance when said first metal level and said second metal level are selected so as to cause said first distance to be smaller than said second distance;
- a dielectric layer deposited over said redistribution layer.

25. The structure of claim 24 wherein said dielectric layer comprises Benzocyclobutene.

* * * * *